United States Patent
Sumiya et al.

(10) Patent No.: US 6,809,040 B2
(45) Date of Patent: Oct. 26, 2004

(54) METHOD FOR MANUFACTURING LAMINATED DIELECTRICS

(75) Inventors: Atsuhiro Sumiya, Hekinan (JP); Eturo Yasuda, Okazaki (JP); Hitoshi Shindo, Okazaki (JP); Yasunori Suzuki, Nishio (JP); Takashi Yamamoto, Chiryu (JP); Toshiatsu Nagaya, Kuwana (JP); Noriaki Kihara, Okazaki (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 10/209,670

(22) Filed: Aug. 1, 2002

(65) Prior Publication Data

US 2003/0027432 A1 Feb. 6, 2003

(30) Foreign Application Priority Data

Aug. 2, 2001 (JP) ........................................ 2001-234740
Jun. 20, 2002 (JP) ........................................ 2002-180167

(51) Int. Cl.[7] .............................................. H01L 21/31
(52) U.S. Cl. ........................................ 438/761; 438/763
(58) Field of Search ............................ 438/761, 763, 438/778, 624

(56) References Cited

U.S. PATENT DOCUMENTS

| | | | | |
|---|---|---|---|---|
| 4,510,000 A | * | 4/1985 | Kumar et al. | 156/89.19 |
| 4,806,188 A | * | 2/1989 | Rellick | 156/89.16 |
| 5,004,715 A | * | 4/1991 | Hakotani et al. | 501/136 |
| 5,128,827 A | * | 7/1992 | Yokotani et al. | 361/309 |
| 5,561,828 A | * | 10/1996 | Igaki et al. | 419/10 |
| 5,672,220 A | * | 9/1997 | Omori et al. | 156/89.12 |
| 5,801,111 A | * | 9/1998 | Wada et al. | 501/138 |
| 5,835,340 A | * | 11/1998 | Wada et al. | 361/321.5 |
| 2002/0057980 A1 | * | 5/2002 | Morita et al. | 419/6 |

FOREIGN PATENT DOCUMENTS

JP        A-7-122456        5/1995

* cited by examiner

Primary Examiner—Matthew Smith
Assistant Examiner—Lex H. Malsawma
(74) Attorney, Agent, or Firm—Nixon & Vanderhye PC

(57) ABSTRACT

A method of manufacturing large-sized laminated dielectrics of high quality which permit adjustment of the atmosphere during sintering process to be accomplished easily, and which can eliminate the problems such as expansion due to reaction with the atmosphere gas. When a laminated body 1, consisting of oxide dielectric layers 2 and inner electrode layers 3 having a base metal such as Cu as a main component, is sintered in a reducing atmosphere, a mixed gas having $CO_2$ gas as a main component and containing optional amount of CO gas and $O_2$ gas is used. By using the equilibrium system of $CO_2 \rightleftharpoons 2CO + (1/2)O_2$ and adjusting the amounts of CO gas and $O_2$ gas, oxygen partial pressure in the atmosphere gas can be easily and stably adjusted and fluctuation and variation in the atmosphere can be suppressed.

20 Claims, 11 Drawing Sheets

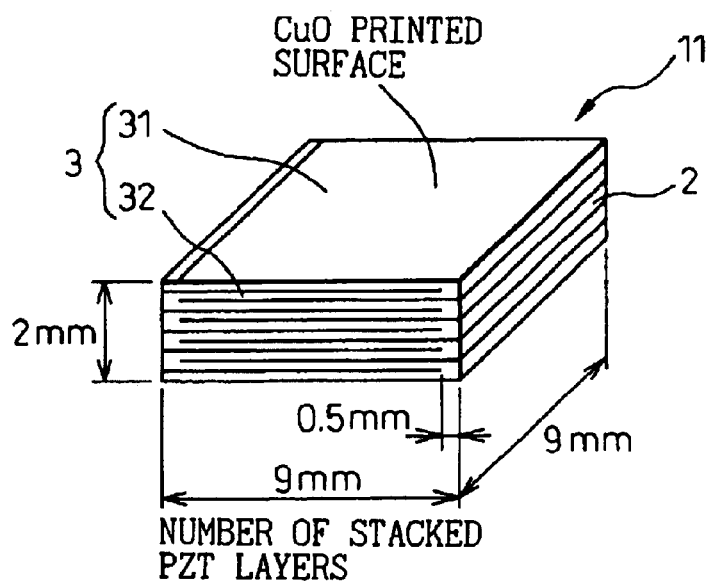
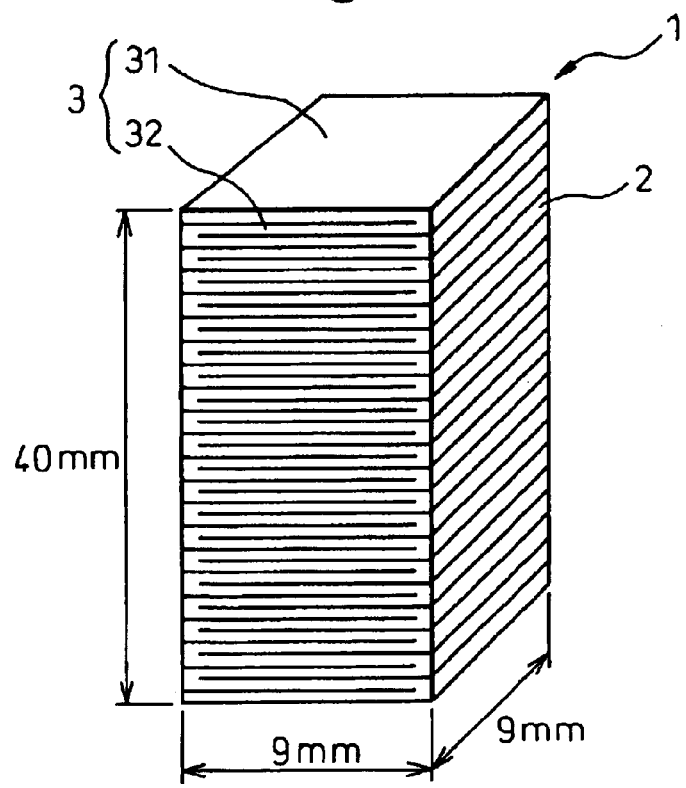

CUTOUT IN THE DIRECTION IN WHICH MgO PLATE IS PERPENDICULAR TO PORES OF CORDIERITE HONEYCOMB BODY

CUTOUT IN THE DIRECTION IN WHICH MgO PLATE IS PARALLEL TO PORES OF CORDIERITE HONEYCOMB BODY

METHOD FOR MANUFACTURING LAMINATED DIELECTRICS

BACKGROUND OF THE INVENTION

1. Field of the Invention

The present invention relates to a method for manufacturing laminated dielectrics used as materials for electronic components such as piezoelectric actuators and the like and, more particularly, to a method for manufacturing laminated dielectrics consisting of a laminated body of oxide dielectric layers such as PZT etc. and inner electrode layers containing a base metal as a main constituent.

2. Description of the Related Art

Laminated dielectrics utilized in electronic components such as piezoelectric actuators, and the like, are formed generally by alternately laminating green sheets of oxide dielectric material such as PZT (lead zirconate titanate) and metal layers to be used as inner electrodes, and by integrally sintering the laminated body as one unit. Conventionally, noble metals such as Pd, Pt, Pd—Ag, etc. are widely used as materials for the inner electrodes. However, noble metals are very expensive and increase the manufacturing cost.

Thus, in recent years, attention has been increasingly paid to base metals (CU, $N_1$, etc.) as the material for the inner electrodes in laminated dielectrics. Although, besides being inexpensive, base metals have other advantages such as good migration resistance, there are also problems associated with the fact that base metals tend to be easily oxidized in an oxidizing atmosphere at high temperatures. Therefore, in sintering a laminated body that employs a base metal as inner electrodes, it is necessary to bake the laminated body in a neutral or reducing atmosphere in order to avoid deterioration of the function of electrodes.

As the neutral or reducing atmosphere, a mixed gas of $N_2$, $H_2$, CO, $CO_2$, $H_2O$, etc. has been typically used. In order to facilitate the adjustment of the oxygen concentration in the atmosphere, Japanese Patent Publication (Kokai) No. 05-335177, for example, discloses a method in which a mixed gas having $CO_2$ or CO gas of high purity as a main component and containing $H_2$ and $O_2$ gases optionally adjustable in concentration, is employed. With this method, the concentration of oxygen can be quickly adjusted to a target value by varying the supply of $H_2$ and $O_2$ gases.

When, however, compounds containing PbO are used in the composition as in oxide dielectrics such as PET, if $H_2$ is contained in the atmosphere gas during sintering, reduction of PbO takes place at temperatures of 300° C. and higher, and the resulting Pb may diffuse, leading to the problem of fluctuations in the composition. Further, when the oxide dielectric contains alkaline earth metals in the composition, if $H_2O$ is contained in the atmosphere, the alkaline earth metals may react with $H_2O$ and lead to expansion of the laminated body (room temperature ~400° C.), allowing only small-sized laminated dielectrics to be fabricated.

SUMMARY OF THE INVENTION

It is an object of the present invention to resolve the above described problems and to provide a method, for manufacturing large-sized laminated dielectrics of high quality, which permits adjustment of the atmosphere during sintering process to be accomplished easily, and which can avoid the problems such as fluctuations of the composition of oxide dielectrics and expansion due to reaction with the atmosphere gas.

According to a first aspect of the invention, a method for manufacturing laminated dielectrics is provided wherein a laminated body consisting of oxide dielectric layers and inner electrode layers containing base metals as the main component is sintered in a reducing atmosphere characterized in that the above mentioned sintering step is performed in a mixed gas having $CO_2$ gas as the main constituent and optional amount of CO gas and $O_2$ gas, and that the oxygen partial pressure in the atmosphere is adjusted within a predetermined range by adjusting the amount of the above mentioned CO gas and $O_2$ gas.

According to the present invention, sintering of laminated dielectrics is performed in a mixed gas having $CO_2$ gas as a main constituent, and further containing CO gas and $O_2$ gas of arbitrarily adjustable concentrations in order to control the oxygen partial pressure in the atmosphere gas at the target oxygen partial pressure. Thus, if the atmosphere in the oven deviates from this target value, amount of supply of CO gas or $O_2$ gas can be increased or decreased so as to quickly adjust the oxygen partial pressure to within a predetermined range. Problems with the conventional method in which $H_2$ gas and $H_2O$ are contained in the atmosphere, such as the fluctuation of the composition of the dielectrics or the expansion of the dielectrics, do not arise with the method of the present invention.

The atmosphere in the oven is maintained in an equilibrium of $CO_2$ gas, CO gas and $O_2$ gas determined by the equation $CO_2 + CO \rightleftharpoons 2CO + (1/2)O_2$. By adjusting the amount of CO gas and $O_2$ gas utilizing this equilibrium system, the oxygen partial pressure in the atmosphere can be easily and stably controlled, and the variation and fluctuation of the atmosphere can be suppressed. Therefore, the atmosphere in the oven can be easily adjusted during a sintering process, and large-sized laminated dielectrics having good appearance and high quality can be obtained.

According to a second aspect of the invention, during the above mentioned sintering step, it is desirable to maintain the ratio of gas components in the mixed gas supplied to the oven preferably in the range of $CO_2:CO:O_2 = 5000:500~0:20~0$, and to maintain the oxygen partial pressure in the atmosphere gas within a proper range so that melting of the base metal electrodes and diffusion of the electrode into the composition can be suppressed.

More specifically, according to a third aspect of the invention, during the above mentioned sintering step, it is desirable to adjust the oxygen partial pressure of the atmosphere gas in the range, depending upon the sintering temperature, such that the reduction of the oxide composing the above mentioned oxide dielectric layers does not occur and the electrical conductivity of the base metal composing the above mentioned inner electrode layers is not impaired. Since the range of oxygen partial pressure in which oxidative diffusion of the base metal electrodes can be suppressed and fluctuation of the composition of the dielectric component can be avoided varies with the sintering temperature, the atmosphere should be adjusted to achieve the optimum oxygen partial pressure depending upon the sintering temperature in order to obtain the laminated dielectrics of better quality and higher reliability.

According to a fourth aspect of the invention, preferably, a reduction processing step in which the above mentioned laminated body is subjected to heat treatment in a reducing atmosphere is provided for performing reduction processing on the inner electrode layers prior to the above mentioned sintering step. During this reduction processing step, the oxygen partial pressure of the atmosphere gas (oxygen partial pressure outside the oven) is preferably maintained in the range of $1\times10^{-14}\sim1\times10^{-25}$ atm so that metallizing process can be accomplished while suppressing the reduction of the oxide dielectrics and avoiding melting of the base metal electrode and diffusion of the electrode into the composition.

According to a fifth aspect of the invention, processings such as sintering etc. can be advantageously performed by disposing aerating boards, formed of materials having no reactivity with the above mentioned laminated body, in generally symmetrical positions on the upper and lower sides, or in a position either on the upper or lower side of the laminated body, so as to be in contact therewith. The above mentioned aerating board can be formed of materials having substantially no reactivity with the laminated body and having aerating pores, for example, oxides of alkaline earth metals such as MgO.

According to a sixth aspect of the invention, a spacer layer consisting of a honeycomb body, a porous structure, a mesh plate or a mesh body, composed of a ceramic or a metal identical to any one of the elements contained in the inner electrode layers of the above mentioned laminated body, may be disposed in generally symmetrical positions on the upper and lower sides, or in a position either on the upper or lower side of the laminated body. When the above mentioned spacer layer having good gas permeability is disposed on the upper and/or lower sides of the laminated body, the atmosphere on the upper and/or lower sides of the laminated body is advantageously homogenized during the sintering and reduction processings.

According to a seventh aspect of the invention, a weight composed of a ceramic or a metal identical to any one of the elements contained in the inner electrode layers of the above mentioned laminated body, may be disposed on the upper side of the laminated body. The size of the above mentioned weight is preferably greater than that of the laminated body so that, when processing such as sintering is performed in this state, the weight can effectively suppress the deformation in the direction of the thickness of the laminated body.

According to an eighth aspect of the invention, in the above mentioned reduction processing step, all or any one or more of the aerating boards, the spacer layers and the weight as described above in the fifth and seventh aspects of the invention, may be used. By appropriately combining these as required, the atmosphere for processing can be diffused evenly over the whole laminated body, thereby eliminating a fluctuation in the reduction of the inner electrode layers so as to obtain an improved quality of the product.

According to a ninth aspect of the invention, in the above mentioned sintering step, all or any one or more of the aerating boards, the spacer layers and the weight as described above in the fifth and seventh aspects of the invention, may be used. By appropriately combining these as required, the sintering atmosphere can be supplied evenly so that the whole laminated body may be sintered evenly and problems such as delamination or cracks may be eliminated.

According to a tenth aspect of the invention, in the sintering step or the reduction processing step, gas permeability for the atmosphere gas is preferably substantially the same on the upper surface and the lower surface of the laminated body. In this manner, the atmosphere gas can be supplied evenly to the upper and lower surfaces of the laminated body so that, when the reduction processing has been accomplished, the amount of reduction of base metals in the inner electrode layer may be made even throughout the device. Also, problems such as diffusion of base metals into the device after the sintering step, defects in the external appearance of the device, and the like, can be avoided.

According to an eleventh aspect of the invention, the present invention can be advantageously applied to the case where total volume of the above mentioned laminated body is as large as 8 mm². When sintering is performed according to the method of the present invention, a difference in the distribution of the atmosphere gas supplied to the above mentioned laminated body can be made small enough to permit even sintering so that large-sized laminated dielectrics of high quality may be realized.

According to a twelfth aspect of the invention, the present invention can be advantageously applied to the case where the above mentioned laminated body has a thickness of 2 mm or more and an area of 4 mm² or larger in the direction parallel to the inner electrode. When sintering is performed according to the method of the present invention, difference in the distribution of the atmosphere gas supplied to the above mentioned laminated body can be made small enough to permit even sintering so that large-sized laminated dielectrics of high quality may be realized.

According to a thirteenth aspect of the invention, the present invention can be most effectively applied to the case where the above mentioned oxide dielectric layer contains lead, in the composition, such as a PZT type material. In this case, deterioration of the quality of the product can be avoided by stably controlling the oxygen partial pressure in the atmosphere gas,and thereby suppressing the reduction of the lead oxides.

According to a fourteenth aspect of the invention, layers containing copper as the main component element are advantageously used as the inner electrode layers of the above mentioned laminated body, and are desirable since they are inexpensive and have good migration resistance.

BRIEF DESCRIPTION OF THE DRAWINGS

FIG. 1(a) and FIG. 1(b) are perspective views showing, respectively, the schematic construction of a laminated body unit and a laminated body obtained by stacking the laminated body units.

DETAILED DESCRIPTION OF THE PREFERRED EMBODIMENTS

Figure 2A:
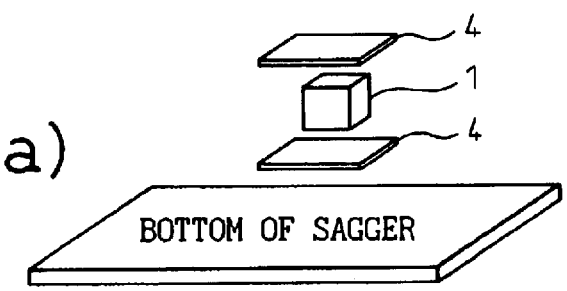
FIGS. 2(a)–2(c) are exploded perspective views showing the jig construction in a degreasing step.

A laminated dielectrics manufactured according to the present invention has a laminated structure in which oxide dielectric layers and inner electrode layers containing a base metal as a main component are alternately stacked. Specifically, PZT type ceramics such as Pb (Ti, Zr) $O_3$, or ceramics obtained by substituting partially with elements such as Sr, Mn, Y, Nb, etc. are advantageously employed as the dielectric materials forming the oxide dielectric layers. Specific details of the composition such as substituent elements, ratio of the blended component elements, and the like can be suitably selected depending upon the required characteristics.

Adjuvant oxides, for example, lead oxide (PbO) blended with tungsten oxide ($WO_3$), may be added to the oxide dielectric layers, so that, at the time of sintering, a liquid phase is formed and the sintering temperature of the oxide dielectrics can be thereby lowered. Preferably, the content of $WO_3$ in the adjuvant oxides is in the range greater than 0.5 mole % and less than 40 mole %, or 16.5±1.5%. The adjuvant oxides may be prepared by weighing PbO and $WO_3$ respectively so as to obtain the compounding ratio in the above described range, and after mixing them, sintering them in order for the reaction to proceed partially This prebaking in the preparation stage needs not necessarily be performed since the prebaking proceeds in the sintering step after mixing the adjuvant oxides with the dielectric material. It is desirable to grind the raw materials into fine powder using a medium agitation mill or the like in order to increase the reactivity.

Base metals such as Cu, Ni, etc. or alloys having base metals as the main component are used as the material for the inner electrode. Preferably, Cu or alloy materials having Cu as the main component are used. After the electrode paste containing these base metals or base metal alloys is printed by screen printing in a predetermined pattern on the surface of the green sheet of the oxide dielectric layers, a predetermined number of sheets are stacked, and adhered to each other under heat and pressure to form a laminated body. This laminated body is degreased to remove binder component etc. Degreasing is performed with the maximum degreasing temperature in the range of 400° C.–650° C. Degreasing may be performed not only in an ambient atmosphere or but also in an atmosphere of pure oxygen.

When electrode paste containing base metal oxide is used, after the laminated body is degreased, and prior to sintering, reduction processing is performed on the base metal oxide. The reduction processing is performed in a reducing atmosphere gas containing, for example, $H_2$, $O_2$, and the oxygen partial pressure is preferably controlled so as to maintain the oxygen partial pressure outside the oven in the range of $1 \times 10^{-14} \sim 1 \times 10^{-25}$ atm. When this is the case, effective ratio of $H_2$ and $O_2$ supplied to the oven is $H_2:O_2=50:50\sim5.5$.

When the oxygen partial pressure outside the oven is below the above range, PbO contained in the oxide dielectric layers is reduced, and as a result, metallic lead is released and reacts with Cu or the like in the electrode material, and undesirable liquid phase is generated during the main processing or during sintering at temperature of 327° C. or higher.

Temperature of the reduction processing should be in the range of 325~400° C., and this temperature should be maintained for 0.25~16 hours. If this temperature is maintained longer than the above range, again the reduction of PbO, as described above, may take place.

Thereafter, laminated dielectrics can be obtained by sintering the laminated body in a reducing atmosphere. As the atmosphere gas during this reduction sintering, a mixed gas having $CO_2$ gas as a main component and containing CO gas and $O_2$ gas is used, and the oxygen partial pressure of the atmosphere gas (oxygen partial pressure in the oven) can be easily controlled by adjusting the amount of CO gas and $O_2$ gas supplied. It is desirable that $CO_2$ gas, CO gas and $O_2$ gas are of high purity of 99.9% or higher, since controllability of the atmosphere can be thereby improved, effect of impurities can be reduced and quality of the product can be stabilized.

The oxygen partial pressure of the atmosphere gas (oxygen partial pressure in the oven) is adjusted in such a range that reduction of PbO does not take place and oxidation of the electrode material does not occur. More specifically, when the sintering temperature is 500~1050° C., the oxygen partial pressure of the atmosphere gas (oxygen partial pressure in the oven) is adjusted in the range of $1 \times 10^{-4} \sim 1 \times 10^{-15}$ atm. At this time, it is desirable that $CO_2$ gas, CO gas and $O_2$ gas are supplied to the oven in the ratio of $CO_2:CO:O_2=5000:50\sim0:20\sim0$, and by controlling the supplied amount to the optimum value, depending upon the sintering temperature, release of PbO and oxidative diffusion of inner electrode materials can be suppressed.

It is also desirable that each of the above steps, especially the sintering step, is processed with jigs of good gas permeability disposed on the upper and lower sides of the laminated body. When there are electrode layers inside the laminated body, diffusion of the atmosphere is blocked, and a difference in the diffusion of the atmosphere from the surfaces parallel to the electrode (upper and lower surfaces) is likely to occur between the region lying in a few layers from the upper and lower surfaces and other region, leading to a fluctuation of characteristics. It is also desirable, in the sintering step, to place the laminated body in the sagger with a weight disposed on it in order to suppress deformation of the sheet. However, since the weight and the sagger act to shield the laminated body from the atmosphere, the atmosphere does not sufficiently diffuse into the upper and lower surfaces directly in contact with these shields. Thus, deformation tends to occur between the central region and the region of a few upper and lower layers. Therefore, in the sintering step, for example, the laminated body is preferably sandwiched between aerating boards disposed on the upper and lower surfaces of the body, and spacer layers of good gas permeability are provided on the outside in order to distribute the atmosphere evenly over the upper and lower surfaces of the laminated body. The aerating board directly in contact with the laminated body is preferably formed of materials having no reactivity with the laminated body. In this manner, a difference in the distribution of atmosphere between the region of the upper and lower surfaces of the laminated body and the central region where the atmosphere diffuses from the sides can be reduced. Deformation due to difference in the distribution of the atmosphere is thereby suppressed, and a difference between the diffusion of the atmosphere from the sides and from the upper and lower surfaces is reduced so that fluctuation of characteristics is unlikely to occur.

It is also desirable for the reduction processing step performed prior to the sintering step to be processed with jigs of good gas permeability disposed on the upper and lower sides, especially on the lower side, of the laminated body. When there is electrode layers inside the laminated body, if a shielding body is directly in contact with the upper or lower surfaces, diffusion of atmosphere from the surfaces parallel to the inner electrode (upper and lower surfaces) cannot be expected, and diffusion of the atmosphere is blocked. The shielding body includes, for example, a weight and a sagger. Since diffusion of the atmosphere takes place predominantly from the surfaces perpendicular to the inner electrodes (sides), reduction of the inner electrode in the interior of the laminated body requires a long time, or may not occur at all. When many laminated bodies are collectively and simultaneously subjected to reduction processing, if the upper surface of the many laminated bodies stacked on a sagger is covered by a large weight, even the diffusion of atmosphere from the surfaces perpendicular to the inner electrode (sides) becomes difficult, thereby leading to fluctuation in the reduction of the inner electrode.

Thus, in reduction processing step, reduction processing is preferably performed with the laminated body raised from the bottom surface of the sagger by disposing a spacer layer of good gas permeability under the laminated body, and thus ensuring good aeration from the lower side.

The same spacer layer, as on the lower side, may be disposed on the upper side so as to sandwich the laminated body in the vertical direction, or the upper side of the laminated body may be left open to ensure good aeration in the vertical direction. A difference between diffusion of the atmosphere from surfaces parallel to the inner electrode (upper and lower surfaces) and diffusion of the atmosphere from surfaces perpendicular to the inner electrode (sides) can be thereby decreased and the even reduction of the inner electrode of the laminated body can be achieved.

Also, in the reduction processing step, aerating boards may be employed in place of, or in addition to, the spacer layers. To ensure sufficient gas permeability, aerating boards formed of a material having high porosity are preferably used. For reasons as described above, use of a weight is undesirable, and is to be avoided as far as possible. On the contrary, however, when the laminated body is a rectangular parallelepiped with a large thickness in the direction perpendicular to the plane of the inner electrode, diffusion of the atmosphere takes place predominantly from surfaces perpendicular to the inner electrode (sides) and, in order to reduce difference of diffusion of the atmosphere between the central portion and the end portion of the rectangular parallelepiped, it is desirable to employ aerating boards, weights, and the like.

As the aerating boards, a gas permeable substance that has no reactivity with PbO contained in the laminated body and has adequate pores is advantageously employed, including oxides of alkaline earth metals, for example, MgO, CaO, SrO, etc. In order to ensure sufficient aeration, the porosity of the aerating boards is preferably 10% or higher. As spacer layers, a ceramic honeycomb body such as cordierite, alumina, titania, and the like, is advantageously used. In degreasing and reduction processing steps, suitable substances are not limited to ceramics, and metals or the like may be employed as long as they are sufficiently permeable to gas, and are resistant to the degreasing and reduction processing. When a metal is used, the metal is preferably identical to one of the elements contained in the inner electrode layers of the laminated body. The shape is not limited to honeycomb body, and it may be in the shape of a porous body, a mesh plate, a mesh body, or the like.

Although it is desirable that these aerating boards and spacer layers of identical shape are respectively disposed in generally symmetrical positions on the upper and lower sides of the laminated body, it is not necessarily required as long as the diffusivity of the atmosphere gas is substantially the same on the upper and lower surfaces of the laminated body, and aerating boards or spacer layers of different size or shape may be used on the upper and lower surfaces. Or, a spacer layer may be provided only one of the upper and lower sides of the laminated body, for example, only on the lower side where diffusivity of atmosphere gas tends to be low. In a sintering step, the laminated body may be supported on an aerating board having no reactivity with the laminated body, and a weight may be preferably placed on the laminated body in order to suppress the deformation of sheets. For example, a ceramic plate of MgO or the like that is larger in size than the laminated body may be used as the weight. The weight may be formed of a metal, and in this case, the metal is preferably identical to one of the elements contained in the inner electrode layers of the laminated body.

When the laminated dielectrics obtained in this manner are to be used as a piezoelectric actuator or the like, side electrodes are formed by applying the electrode paste on the sides of the laminated body and by sintering to form conductive path between the inner electrodes. Thereafter, the side electrodes are connected to external electrodes, and polarization processing is performed to obtain a piezoelectric actuator or the like.

Specific embodiments of the method for manufacturing a laminated dielectrics according to the present invention will now be described.

Preparation Step for Raw Materials of the Dielectrics

First, the adjuvant oxide to be added to the oxide dielectrics was prepared. High purity powders of lead oxide and tungsten oxide from which the adjuvant oxide is to be composed were weighed in the compounding ratio of PbO 83.5 mole %: $WO_2$ 16.5%. These powders were dry-blended, and then sintered at 500° C. for 2 hours in an ambient atmosphere to obtain prebaked powder of the adjuvant oxide (chemical formula: $Pb_{0.035}WO_{0.165}O_{1.33}$) in which parts of PbO and $WO_3$ have reacted. Then, this prebaked powder of the adjuvant oxide was ground using a medium agitation mill, and was dried to obtain the powder of adjuvant oxide having increased reactivity.

Separately, in order to obtain the oxide dielectrics with a final composition of $(Pb_{0.93}O_{009})\{Zr_{0538} Ti_{0452} (Y_{05} Nb_{05})_{038}\}O_3+0.5$ atm%$Mn_2O_3$, high purity powders of raw materials of lead oxide, strontium oxide, zirconium oxide, titanium oxide yttrium oxide, niobium oxide, manganese oxide were weighed. These powders were dry-blended, and prebaked for 7 hours at 850° C. in an ambient atmosphere to obtain the prebaked dielectric powder. 2.5 liters of water and a dispersant (2.5 wt % relative to the prebaked dielectric powder) were mixed beforehand, and 4.7 kg of the prebaked powder of the dielectrics was gradually mixed into this mixture to obtain slurry of the prebaked dielectric powder. This slurry of the prebaked dielectric powder was mixed and ground using a pearl mill (a medium agitation mill) to control the particle diameter to 0.2 $\mu$m or less.

After subjecting the prebaked powder dielectrics to the medium agitation mill to obtain slurry of the prebaked powder dielectrics, 4 wt % of a binder and 1.9 wt % of releasing agent relative to total weight of the prebaked powder dielectrics, and 13.5 g of the adjuvant oxide (0.5 mole % of $Pb_{0035}WO_{0.165}O_{133}$) obtained as described above relative to 1600 g of the prebaked powder dielectrics, were mixed into the slurry. After 3 hours of stirring, the mixture was dried using a spray drier, and a granulating powder of the prebaked dielectrics was obtained.

Laminated Body Forming Step

To the granulating powder thus obtained, a solvent, a binder, a dispersant and the like were added, and after the mixture was ground and mixed overnight using a ball mill, the mixture was degassed under vacuum. Then, the mixture was formed into green sheets using a doctorblade apparatus with blade separation of 125 μm. The green sheets were dried at 80° C., and then were cut to the size of 100 mm×150 mm with a sheet-cutter to obtain a predetermined number of green sheets of identical shape.

Next, the electrode paste was prepared by adding 1.11 g of Cu powder (1050YP, manufactured by Mitsui Kinzoku Co.) and 0.09 g of a co-powder to 1,800 g of CuO paste (containing 50 wt % of CuO, with specific surface area of 10 $m^2/g$), and mixing in a centrifugal agitation and degassing apparatus. As used herein, co-powder means a powder material which contains at least one of the elements composing the oxide dielectrics such as PZT, and which is added to the electrode in order to improve adhering strength between the electrode layers and the dielectric layers, and to reconcile the shrinkage of the electrode layers and the dielectric layers.

This electrode paste was printed to the upper surface of each green sheet to the thickness of 5~8 μm in a predetermined print pattern using a screen printing machine, and was dried at 130° C. for 1 hour. Then, 20 sheets of the green sheet with electrode printed thereon (and three more sheets of dummy green sheet with no electrode printed thereon each on the upper and lower side) were stacked, fixed with a sheet pressing jig, and were pressed under heat and pressure at 120° C. and 80 $kg/m^2$ for 10 minutes to obtain a mother block. The mother block, pressed under heat and pressure as described above, was cut to the size of 9 mm×9 mm with a sheet cutter.

Although the mother block was cut to the size of 9 mm×9 mm in this embodiment, the present invention can be applied to any size of 2 mm×2 mm or larger to obtain beneficial effects. Number of stacked sheets is not limited to 20 sheets as in this embodiment, and any number of sheets may be stacked in the present invention. Generally, if the thickness is 2 mm or more and the total volume is 8 $mm^3$ or more, the present invention can be applied to obtain the beneficial effect of decreased difference of atmosphere distribution supplied to the laminated body and to achieve large-sized and homogeneous dielectrics.

Next, a laminating apparatus was used, to press under heat and pressure at 120° C. and 160 kg/m2 for 10 minutes, to obtain a laminated body unit 11 (9 mm×9 mm×2 mm) consisting of oxide dielectric layers 2 and inner electrode layers 3 as shown in FIG. 1(a). Here, the inner electrode layers 3 are disposed such that layers of printed pattern 31 having the electrode exposed on the right side and layers of printed pattern 32 having the electrode exposed on the left side are positioned alternately. 20 such laminated body units 11 were stacked and were again pressed under heat and pressure at 80° C. and 500 $kg/m^2$ for 10 minutes to obtain a laminated body 1 (9 mm×9 mm×40 mm) consisting of oxide dielectric layers 2 and inner electrode layers 3 as shown in FIG. 1(b).

Degreasing Step

As shown in FIG. 2(a), MgO plates 4 (15 mm×15 mm×1 mm) having porosity of 20% were disposed as aerating boards above and below the obtained laminated body 1, and these were placed in a MgO sagger. Degreasing was performed in an ambient atmosphere by controlling temperature according to the degreasing pattern as shown in FIG. 2(d) (Maximum temperature of degreasing of 500° C.). Although MgO plates 4 of identical size were used on the upper and lower side of the laminated body as aerating boards, the aerating boards may be of any material as long as they are ceramic plates having a porosity of 10%. The sizes of the aerating boards may differ as long as substantially similar aeration can be ensured.

Figure 2B:
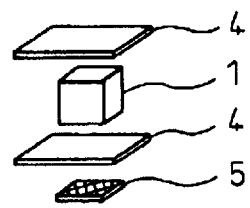
Figure 2C:
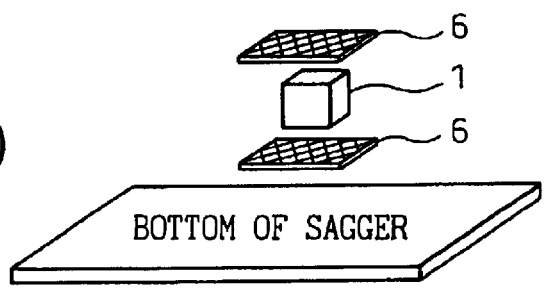
Figure 2D:
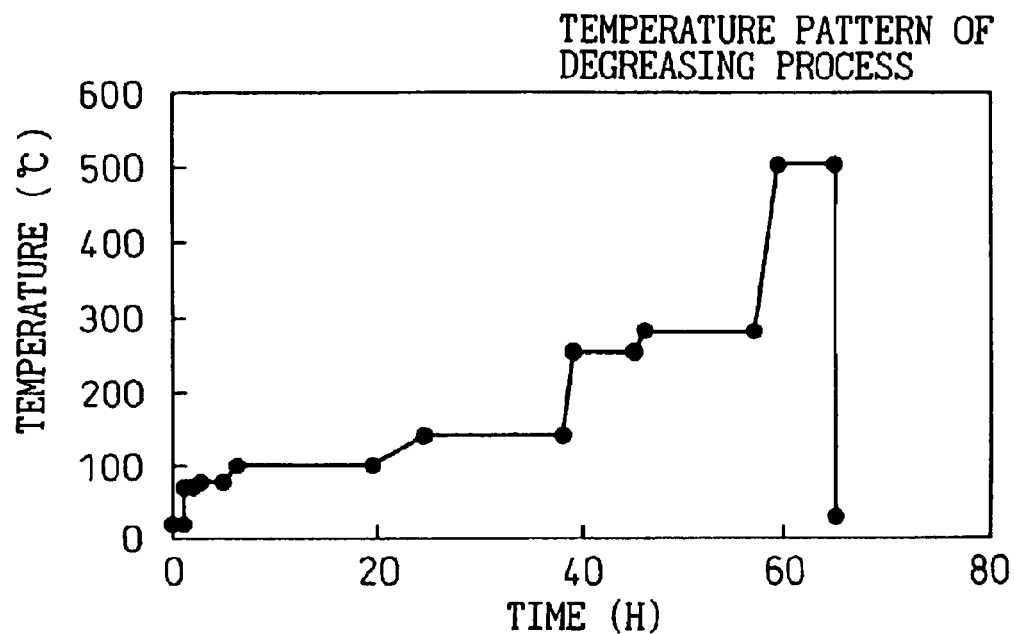
FIG. 2(d) is a graph showing the temperature pattern of the degreasing process.

Although, in this embodiment, a MgO plate 4 was directly placed on the bottom surface of the sagger, a cordierite honeycomb body 5 may be provided as a spacer layer between the MgO plate 4 and the sagger as shown in FIG. 2(b) to improve the aeration of the lower region. The spacer layer is not limited to cordierite, and may be of materials, for example, alumina, titania, metal, or the like, and may be of any shape, including, besides a honeycomb body, a porous body, a mesh plate, a mesh body, or the like. As shown in FIG. 2(c), in place of the MgO plate 4 as an aerating board, a metal mesh plate 6 may be provided as a spacer layer.

Cu Reduction Processing Step

Figure 3:
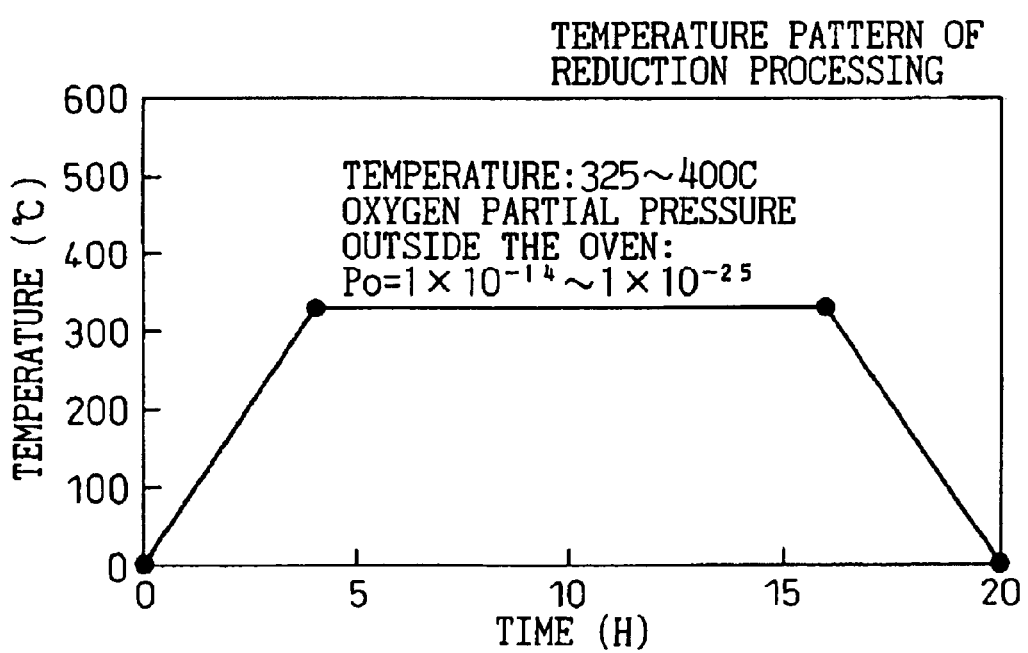
FIG. 3 is a graph showing the temperature pattern of the reduction processing.

Reduction processing was performed on the degreased laminated body 1 according to the reduction processing pattern as shown in FIG. 3. In an atmosphere containing Ar—$H_2$ (1%) 5000 ml and $O_2$ (pure) 6.5~6 ml, oxygen partial pressure during reduction processing was controlled, using oxygen partial pressure outside the oven, to $1\times10^{-23.5}$ atm. Processing temperature (maximum temperature) was about 350° C., and this temperature was maintained for 12 hours.

As in the degreasing step described above, reduction processing was performed with the laminated body 1 placed in the sagger and with MgO plates 4 disposed as aerating boards on the upper and lower sides of the laminated body 1. However, aeration in the lower region may be assured by using a metal mesh plate 6 as a spacer layer in place of the MgO plate 4, or by providing a cordierite honeycomb body 5 as a spacer layer between the MgO plate 4 and the sagger.

Stainless metal, which is more reactive with oxygen than the electrode material, is used as the material for the inside wall of the oven. With this construction, in an atmosphere of a certain oxygen partial pressure, the oven wall reacts with the trace amount of oxygen to form an oxide coating layer that can react reversibly with oxygen so that, when the oxygen partial pressure deviates toward reducing side, it can release oxygen, and when the oxygen partial pressure deviates toward oxidation side, it can accumulate oxygen to maintain change of the oxygen partial pressure constant. Further, in an atmosphere in which the electrode material is slightly oxidized, the oven wall is oxidized before the electrode material and protects the Cu electrode material from oxidation.

Regarding the atmosphere during reduction processing, no restriction is imposed on the concentration of gas or on the processed amount as long as the oxygen partial pressure outside the oven in the range of $1\times10^{-14}\sim1\times10^{-25}$ atm is achieved (In this state, effective ratio of $H_2$ and $O_2$ supplied to the oven is in the range of $H_2:O_2=50:50\sim50:5.5$). The processing temperature may be in the range 305~400° C. and retaining time period may be in the range of 0.25~16 hours.

Reduction Sintering Step

Figure 4A:
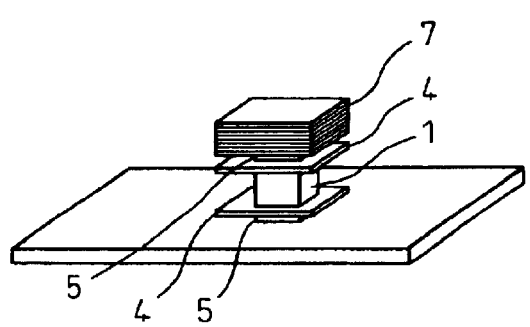
FIG. 4(a) is a perspective view showing the jig construction of the sintering step.
Figure 4B:
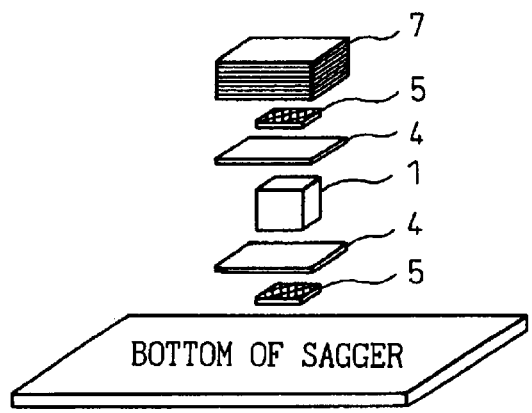
FIGS. 4(b) and 4(c) are an exploded perspective view and a side view, respectively, of 4(a)
Figure 4C:
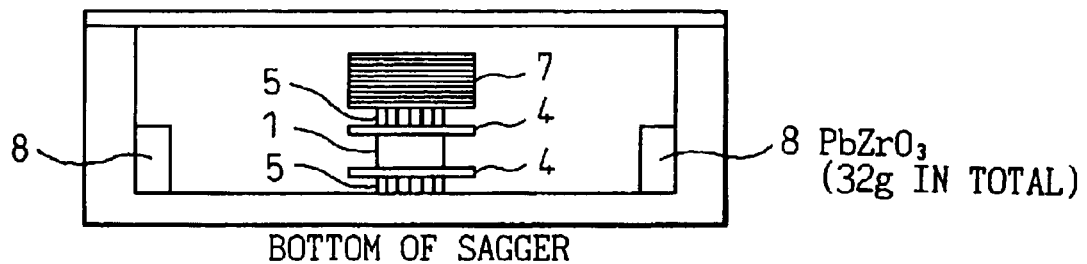

After reduction processing has been performed, the laminated body 1 was placed in the MgO sagger and sintered in a reducing atmosphere. The jig construction in this step was as shown in FIG. 4(a), (b). MgO plates 4 (15 mm×15 mm×1 mm) and cordierite honeycomb bodies 5 were respectively disposed above and below the laminated body 1, and a MgO weight 7 (1~10 g) was provided on the top. External shape of the MgO weight 7 was approximately the same as the MgO plate 4. Further, in order to avoid fluctuation of the composition due to evaporation of PbO from the laminated body 1 at high temperature, suitable amount (32 g in total) of lead zirconate ($PbZrO_3$) 8 was disposed on the circumference of the bottom surface of the sagger.

Figure 4D:
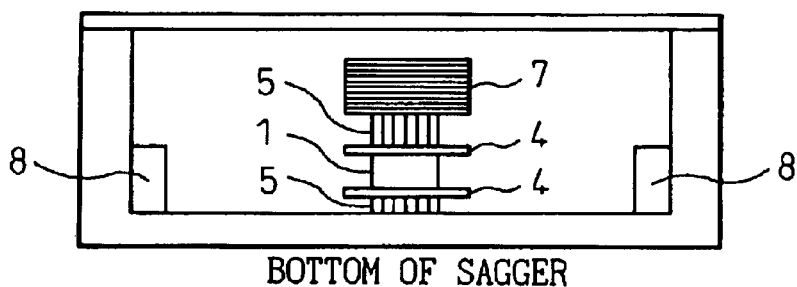
FIGS. 4(d) and 4(e) are side views showing another example of the jig construction.
Figure 4E:
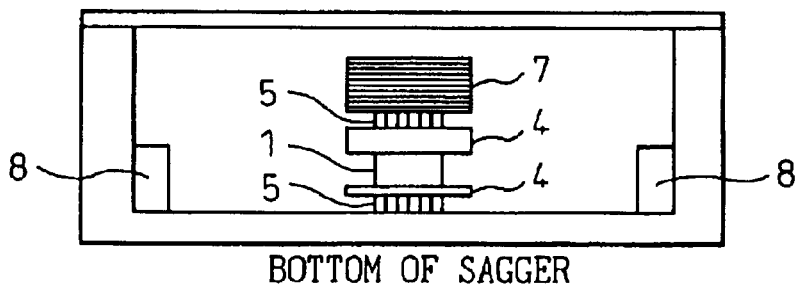
Figure 4F:
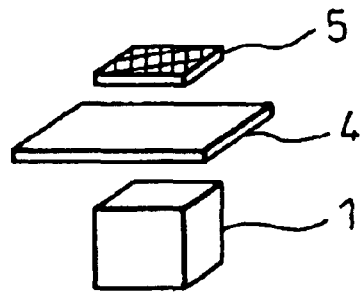
FIGS. 4(f) and 4(g) are exploded perspective views showing the cases where the honeycomb structure and pores of aerating boards are perpendicular and parallel, respectively.
Figure 4G:
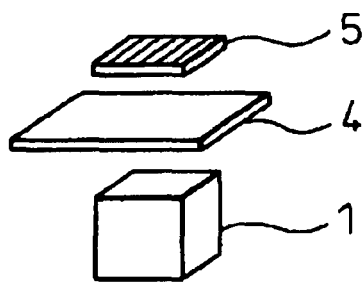

Here, MgO plates 4, and cordierite honeycomb bodies 5 of same porosity and same size were disposed above and below the laminated body 1. As shown in FIGS. 4(d), (e), when aerating boards, or spacer layers, of the same size are used, the porosity of the material should be substantially the same. Cordierite honeycomb body 5 may be positioned in two different ways depending upon the direction in which it is cut out. It may be cut out in a direction such that MgO plates 4 and pores of cordierite honeycomb body 5 are perpendicular as shown in FIG. 4(f), or in a direction such that MgO plates 4 and pores of cordierite honeycomb body 5 are parallel as shown in FIG. 4(g).

Although MgO plates 4 were employed as aerating boards in this embodiment, aerating boards may be of any material as long as it does not react with the compound containing PbO. For example, CaO plates or SrO plates, preferably those with porosity of 10% or more, may be used.

Figure 5:
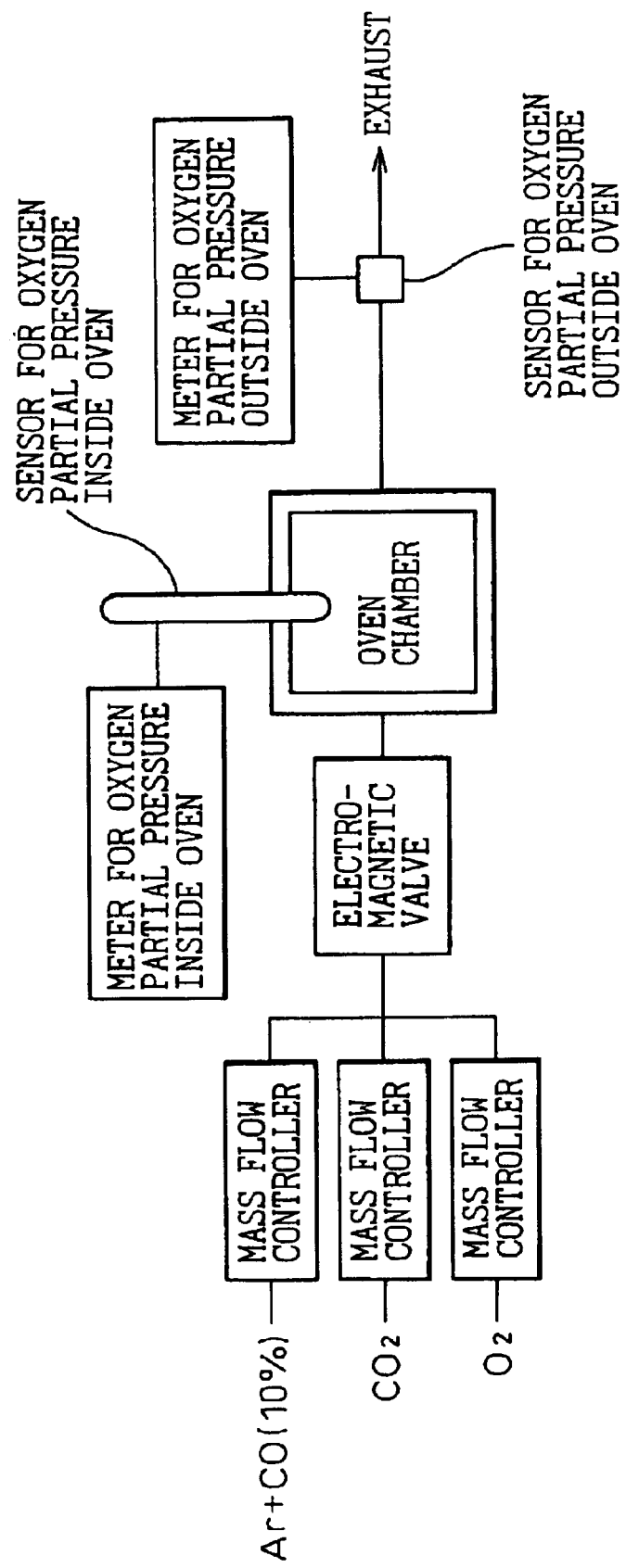
FIG. 5 is a view showing the construction of the sintering oven and the piping system in the sintering step.
Figure 6A:
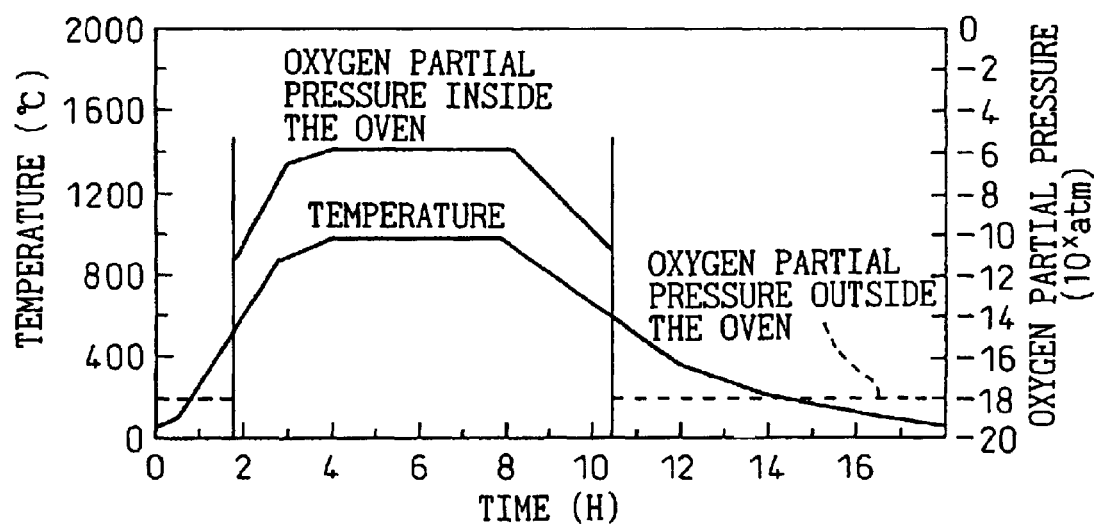
FIG. 6(a) is a graph showing target pattern of the temperature and the oxygen partial pressure.
Figure 6B:
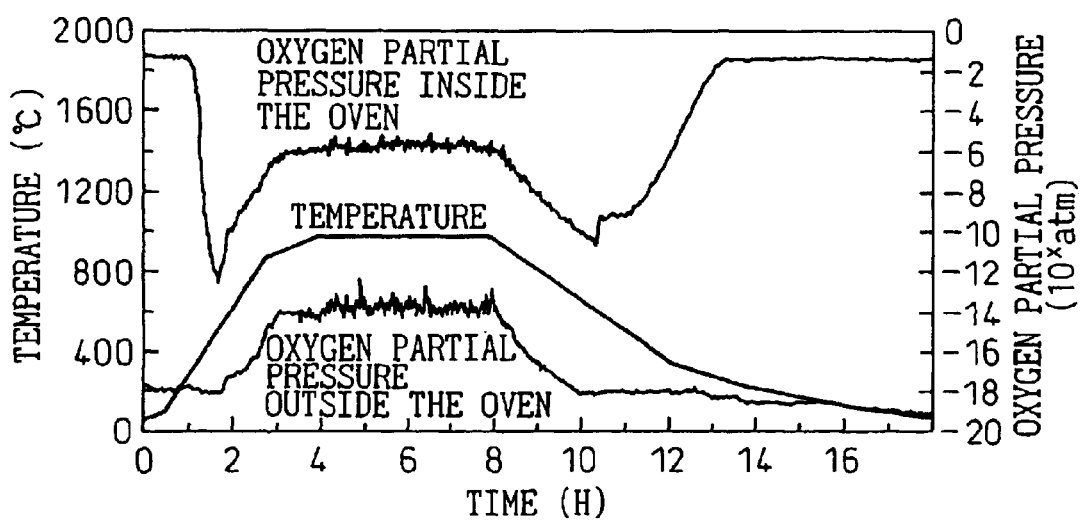
FIG. 6(b) is a graph showing actual pattern of the temperature and the oxygen partial pressure.
Figure 6C:
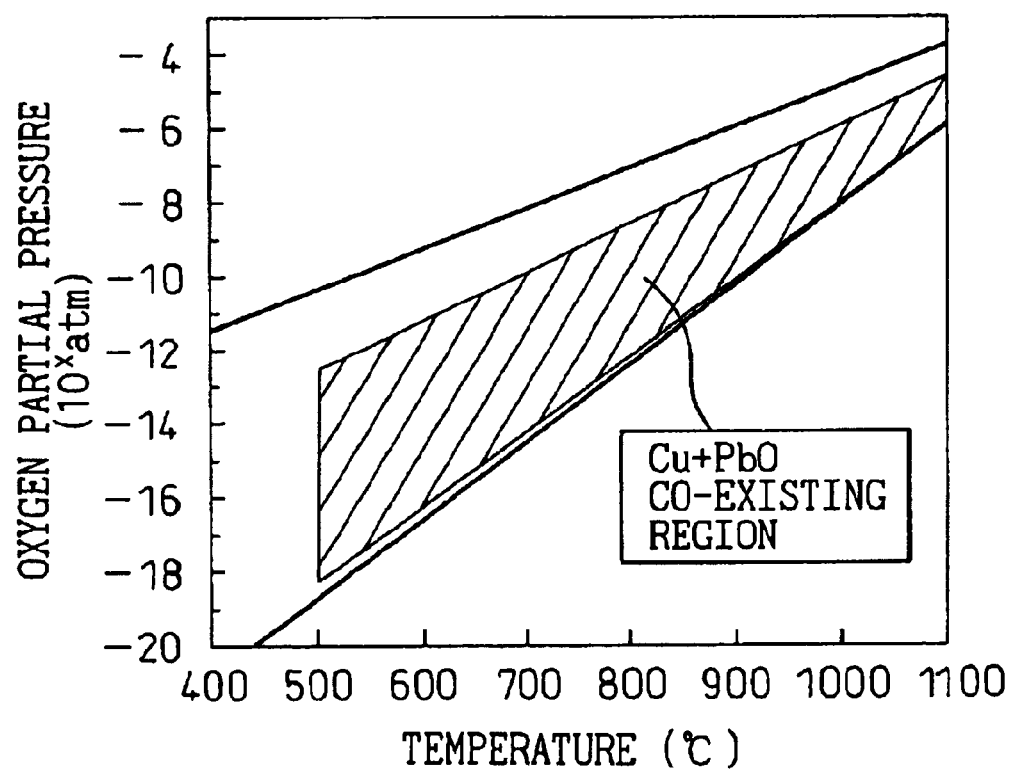
FIG. 6(c) is a view showing the relation of temperature-oxygen partial pressure where oxidation of Cu and reduction of PbO take place.

As shown in FIG. 5, the sagger with the laminated body 1 disposed as described above was placed in an oven which permits the laminated body to be sintered in a reducing atmosphere, and reduction sintering was performed following the temperature and atmosphere pattern as shown in FIGS. 6(a) to 6(c). As shown in FIG. 5, pipes are connected to the oven chamber for introducing $CO_2$ (pure), Ar—CO (10%) 5000 ml and $O_2$ (pure), and the flow of respective gas is adjustable using a mass flow controller.

A stainless metal which has higher reactivity with oxygen than the electrode material is used as the material of the inside wall of the oven. With this construction, in an atmosphere with a certain oxygen partial pressure, the oven wall reacts with the trace oxygen to form an oxide coating which can react with oxygen reversibly such that, if oxygen partial pressure deviates toward reducing side, it can release oxygen, and if oxygen partial pressure deviates toward oxidation side, it can accumulate oxygen to maintain the change of oxygen partial pressure constant. Further, in an atmosphere in which the electrode material is slightly oxidized, the oven wall is oxidized before the electrode material and protects the Cu electrode material from oxidation.

The temperature was raised following the pattern of temperature and atmosphere as shown in FIG. 6(a), and the sintering temperature of about 950° C. was maintained with the oxygen partial pressure inside the oven of $1\times10_{-6}$ atm for about 4 hours to obtain the sintered dielectrics. Profile during this reduction sintering was as shown in FIG. 6(b), and with a constant temperature and oxygen partial pressure, stable atmosphere was realized within $10^y$ (y=x±0.3) atm relative to the target value x.

The temperature/atmosphere pattern is not limited to that shown in FIG. 6(a). Above 500° C., reduction sintering may be performed within the range of the temperature—oxygen partial pressure as shown in FIG. 6(c). As shown in the Figure, the range of oxygen partial pressure can be set such that no reduction of PbO takes place and oxidation of Cu does not occur, depending upon the sintering temperature, and same effect can be obtained. Here, it is desirable that $CO_2$, CO and $O_2$ gases are supplied to the oven in the ratio of $CO_2:CO:O_2=5000:500\sim0:20\sim0$. The rate of temperature rise is preferably set within the range of 300—20° C./hour. In order to control oxygen partial pressure, it is more advantageous to use the buffer gas system of $CO_2$-CO gases as in the present invention than to perform sintering in an inert gas atmosphere such as in $N_2$, since, when $O_2$ is added to change oxygen partial pressure, the change of the oxygen partial pressure is slower and more stable.

Figure 7:
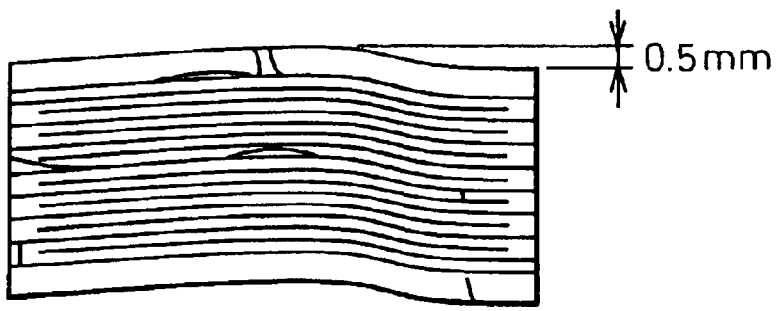
FIG. 7 is a side view showing external appearance of laminated dielectrics manufactured by the conventional method.
Figure 8:
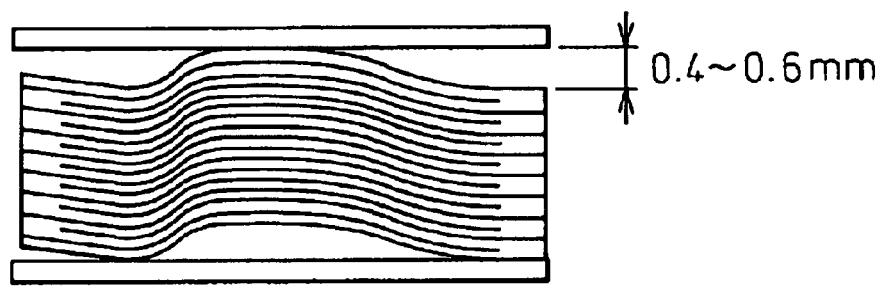
FIG. 8 is a side view showing external appearance of laminated dielectrics manufactured by the conventional method.
Figure 9:
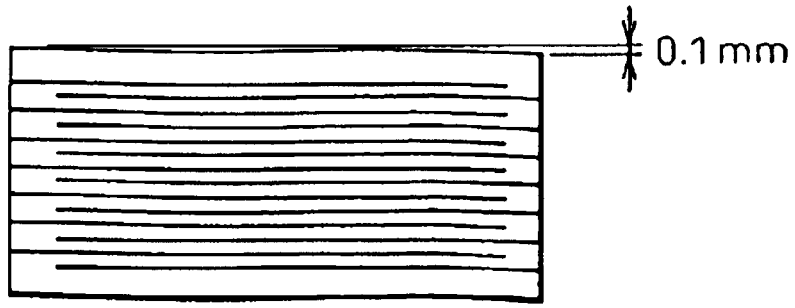
FIG. 9 is a side view showing external appearance of laminated dielectrics manufactured by the method of the present invention.

In general, laminated dielectrics exhibit an overall shrinkage after the reduction sintering. If distribution of the atmosphere supplied to the laminated body 1 varies in the direction of the thickness of the laminated body, the shrinkage of the sheets does not occur evenly, and as a result, deformation develops widely with strains distributed throughout the laminated body, as shown in FIGS. 7 and 8. When such a deformation develops, cavities, longitudinal cracks between sheets, delamination between sheets, and the like may also appear at the same time, as shown in FIG. 7.

On the other hand, according to the method of the present invention, the cordierite honeycomb bodies 5 that are disposed above and below act as spacer layers so as to diffuse the atmosphere, having oxygen partial pressure adjusted to a predetermined range, uniformly onto one of the surfaces of the MgO plate 4 disposed as an aerating board. This atmosphere further passes through the pores in the MgO plate 4 and diffuses to the other surface of the MgO plate. Thus, a sufficient amount of the atmosphere is uniformly supplied to the laminated body 1 in contact with this surface. As the MgO plates 4 and the cordierite honeycomb bodies 5 are disposed symmetrically in vertical direction relative to the laminated body 1, approximately the same amount of atmosphere is supplied to the upper and lower surfaces of the laminated body 1, and gives rise to similar shrinkage in the upper and lower surfaces. With this construction, a difference in shrinkage between the portion of a few upper and lower layers and other portion of the laminated body 1 can be eliminated so that laminated dielectrics of good appearance having little deformation and strain can be obtained.

Figure 10A:
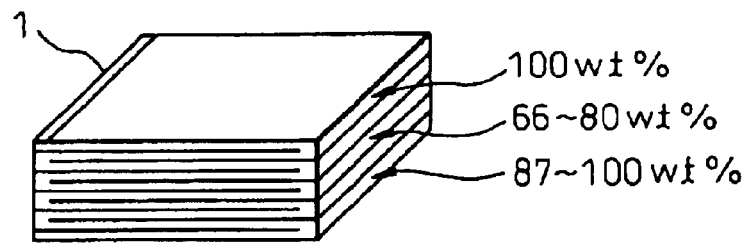
FIG. 10(a) is a perspective view of a laminated body showing the proportion of reduction of inner electrodes when there is a shield.
Figure 10B:
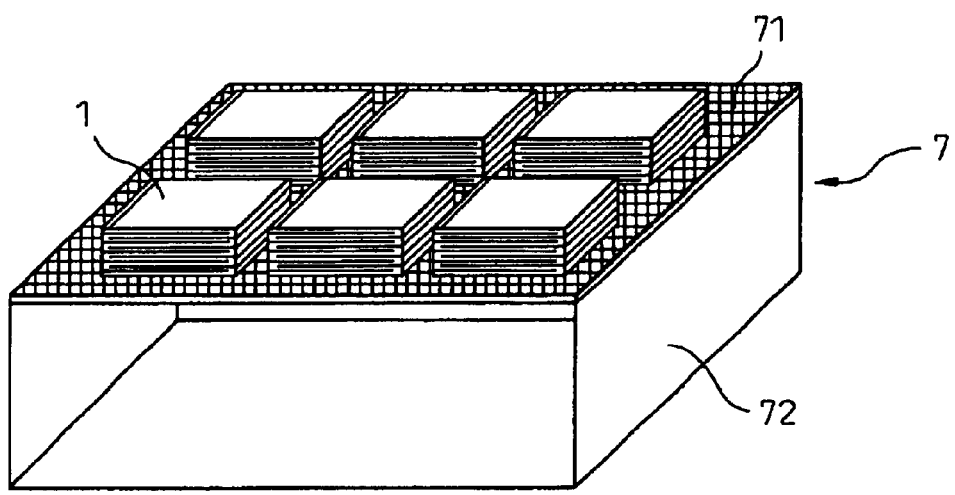
FIG. 10(b) is a view showing the method of reduction processing when a spacer layer is disposed.
Figure 10C:
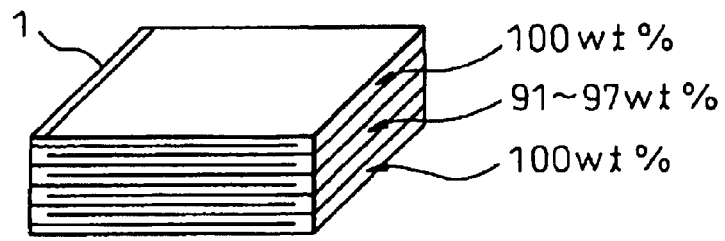
FIG. 10(c) is a perspective view of the laminated body showing the proportion of reduction of inner electrodes when reduction processing is performed by the method of FIG. 10(b).

When an electrode paste containing oxides of a base metal such as Cu is used, in the reduction processing step for reducing the inner electrode prior to the reduction Wintering, the reduction ratio varies widely in various portions of the inner electrodes if the above reduction processing is performed with the laminated body 1 disposed directly on the sagger, as shown in FIG. 10(a). For example, the reduction ratio is 100% in the upper surface portion that is exposed to the atmosphere, is 87 to 100% in the lower surface portion where aeration is blocked by the surface of the sagger, and the reduction ratio greatly drops to 66 to 80% in the central portion of the laminated body. On the other hand, when a hollow spacer 7 having a Cu mesh plate 71 as the upper surface and Cu plates 71 as the sides and bottom surface is disposed between the laminated body 1 and the sagger, and the above reduction processing is performed with the laminating body placed on the Cu mesh plate 72, as shown in FIG. 10(b), the reduction ratio is 100% in the upper and lower surface portion and 91 to 97% in the interior portion of the laminated body. Thus, by decreasing difference of the diffusion of the atmosphere, the entire laminated body 1 can be reduced uniformly. The above described reduction ratio was determined, after the laminated body was subjected to the reduction processing, by isolating each portion and quantitatively analyzing the inner electrode (Cu) using an x-ray thin-film analyzing technique.

What is claimed is:

1. A method for manufacturing laminated dielectrics, comprising the step of sintering, in a reducing atmosphere, a laminated body consisting of oxide dielectric layers and inner electrode layers having a base metal as a main constituent, characterized in that said sintering step is performed in a mixed gas having $CO_2$ gas as a main component and containing optional amounts of CO gas and $O_2$ gas, and that oxygen partial pressure in the atmosphere is adjusted to a predetermined range by adjusting the amount of said CO gas and $O_2$ gas,
wherein aerating boards formed of a material having no reactivity with said laminated body are provided in generally symmetrical positions on the upper and lower sides, or in a position either on the upper or the lower side, of said laminated body, and in contact with said laminated body.

2. A method for manufacturing laminated dielectrics according to claim 1, wherein ratio of each gas component in the mixed gas supplied to the oven in said sintering step is $CO_2:CO:O_2=5000:500\sim0:20\sim0$.

3. A method for manufacturing laminated dielectrics according to claim 1, wherein oxygen partial pressure is adjusted within a range depending upon the sintering temperature, such that reduction of oxides composing the oxide dielectric layers does not occur and the electrical conductivity of the base metal composing said inner electrode layers is not deteriorated.

4. A method for manufacturing laminated dielectrics according to claim 1, further comprising the step of reduction processing wherein said laminated body is heat-treated in a reducing atmosphere prior to said sintering step, characterized in that oxygen partial pressure in the atmosphere gas (oxygen partial pressure outside the oven) is in the range of $1\times10^{-14}\sim1\times10^{-25}$ atm.

5. A method for manufacturing laminated dielectrics according to claim 4, wherein the reduction processing is performed using said aerating boards provided in generally symmetrical positions on the upper and lower sides, or in a position either on the upper or the lower side, of said laminated body, and in contact with said laminated body.

6. A method for manufacturing laminated dielectrics according to claim 1, wherein sintering is performed using said aerating boards which are provided in generally symmetrical positions on the upper and lower sides, or in a position either on the upper or the lower side, of said laminated body, and in contact with said laminated body.

7. A method for manufacturing laminated dielectrics according to claim 1, wherein said laminated body has total volume of 8 $mm^3$ or more.

8. A method for manufacturing laminated dielectrics according to claim 1, wherein said laminated body has a thickness of 2 mm or more and an area parallel to the inner electrode of 4 $mm^2$ or more.

9. A method for manufacturing laminated dielectrics according to claim 1, wherein said oxide dielectric layers contain lead in the composition.

10. A method for manufacturing laminated dielectrics according to claim 1, wherein said inner electrode layers of said laminated body contain copper as a main constituent element.

11. A method for manufacturing laminated dielectrics, comprising the step of sintering, in a reducing atmosphere, a laminated body consisting of oxide dielectric layers and inner electrode layers having a base metal as a main constituent, characterized in that said sintering step is performed in a mixed gas having $CO_2$ gas as a main component and containing optional amounts of CO gas and $O_2$ gas, and that oxygen partial pressure in the atmosphere is adjusted to a predetermined range by adjusting the amount of said CO gas and $O_2$ gas,
wherein spacer layers consisting of a honeycomb body, a porous body, a mesh plate and a mesh body formed of ceramic or a metal identical to any of the elements contained in said inner electrode layers of said laminated body, are disposed in generally symmetrical positions on the upper and lower sides, or in a position either on the upper or the lower side, of said laminated body.

12. A method for manufacturing laminated dielectrics according to claim 11, wherein sintering is performed using said spacer layers disposed in generally symmetrical positions on the upper and lower sides, or in a position either on the upper or the lower side, of said laminated body.

13. A method for manufacturing laminated dielectrics according to claim 11, further comprising the step of reduction processing wherein said laminated body is heat-treated in a reducing atmosphere prior to said sintering step, characterized in that oxygen partial pressure in the atmosphere gas (oxygen partial pressure outside the oven) is in the range of $1\times10^{-14}\sim1\times10^{-25}$ atm.

14. A method for manufacturing laminated dielectrics according to claim 13, wherein the reduction processing is performed using said spacer layers disposed in generally symmetrical positions on the upper and lower sides, or in a position either on the upper or the lower side, of said laminated body.

15. A method for manufacturing laminated dielectrics, comprising the step of sintering, in a reducing atmosphere, a laminated body consisting of oxide dielectric layers and inner electrode layers having a base metal as a main constituent, characterized in that said sintering step is performed in a mixed gas having $CO_2$ gas as a main component and containing optional amounts of CO gas and $O_2$ gas, and that oxygen partial pressure in the atmosphere is adjusted to a predetermined range by adjusting the amount of said CO gas and $O_2$ gas,
wherein a weight formed of ceramic or a metal identical to any of the elements contained in said inner electrode layers of said laminated body is disposed on the upper side of said laminated body, characterized in that external shape of said weight is larger than said laminated body.

16. A method for manufacturing laminated dielectrics according to claim 15, wherein sintering is performed using said weight disposed on the upper side of said laminated body and formed of ceramic or a metal identical to any of the elements contained in said inner electrode layers of said laminated body.

17. A method for manufacturing laminated dielectrics according to claim 15, further comprising the step of reduction processing wherein said laminated body is heat-treated in a reducing atmosphere prior to said sintering step, characterized in that oxygen partial pressure in the atmosphere gas (oxygen partial pressure outside the oven) is in the range of $1 \times 10^{-14} \sim 1 \times 10^{-25}$ atm.

18. A method for manufacturing laminated dielectrics according to claim 17, wherein the reduction processing is performed using said weight disposed on the upper side of said laminated body and formed of ceramic or a metal identical to any of the elements contained in said inner electrode layers of said laminated body.

19. A method for manufacturing laminated dielectrics, comprising the step of sintering, in a reducing atmosphere, a laminated body consisting of oxide dielectric layers and inner electrode layers having a base metal as a main constituent, characterized in that said sintering step is performed in a mixed gas having $CO_2$ gas as a main component and containing optional amounts of CO gas and $O_2$ gas, and that oxygen partial pressure in the atmosphere is adjusted to a predetermined range by adjusting the amount of said CO gas and $O_2$ gas, wherein diffusivity of the atmosphere gas to the upper and lower surface of said laminated body in said sintering step is substantially the same.

20. A method for manufacturing laminated dielectrics comprising the step of sintering, in a reducing atmosphere, a laminated body consisting of oxide dielectric layers and inner electrode layers having a base metal as a main constituent, characterized in that said sintering step is performed in a mixed gas having $CO_2$ gas as a main component and containing optional amounts of CO gas and $O_2$ gas, and that oxygen partial pressure in the atmosphere is adjusted to a predetermined range by adjusting the amount of said CO gas and $O_2$ gas, further comprising the step of reduction processing wherein said laminated body is heat-treated in a reducing atmosphere prior to said sintering step, characterized in that oxygen partial pressure in the atmosphere gas (oxygen partial pressure outside the oven) is in the range of $1 \times 10^{-14} \sim 1 \times 10^{-25}$ atm, wherein the diffusivity of the atmosphere gas to the upper and lower surface of said laminated body in said reduction processing step is substantially the same.

* * * * *